(12) United States Patent
Tsuru

(10) Patent No.: US 6,563,334 B2
(45) Date of Patent: May 13, 2003

(54) INSULATING FILM METHOD AND APPARATUS THEREFOR

(75) Inventor: Kiyohiro Tsuru, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/969,695

(22) Filed: Oct. 3, 2001

(65) Prior Publication Data

US 2002/0070749 A1 Jun. 13, 2002

(30) Foreign Application Priority Data

Oct. 4, 2000 (JP) ............................ 2000-304893

(51) Int. Cl.$^7$ ................................................. G01R 31/26
(52) U.S. Cl. ............................................ 324/766; 324/765
(58) Field of Search ............................... 324/765, 766; 365/171, 100, 461; 438/516, 513, 17

(56) References Cited

U.S. PATENT DOCUMENTS

| | | | | | |
|---|---|---|---|---|---|
| 3,803,489 A | * | 4/1974 | Miller | ........................ | 324/765 |
| 3,943,442 A | * | 3/1976 | Fletcher et al. | ............. | 324/765 |
| 4,827,212 A | * | 5/1989 | Kamieniecki | ............... | 324/765 |
| 5,786,689 A | * | 7/1998 | Kimura | .................... | 324/158.1 |
| 6,339,357 B1 | * | 1/2002 | Yamasaki et al. | ........... | 327/538 |
| 6,469,535 B1 | * | 10/2002 | Egashira et al. | ............ | 324/765 |

* cited by examiner

*Primary Examiner*—N. Le
*Assistant Examiner*—Wasseem H. Hamdan
(74) *Attorney, Agent, or Firm*—Adams & Wilks

(57) ABSTRACT

A method of judging whether dielectric breakdown of an insulating film in a semiconductor device has occurred due to the application of a current to the insulating film. A voltage Vi is measured by applying a current Ii to the insulating film for an arbitrary time period. Next, a voltage Vi+1 is measured by applying a current Ii+1 ($|Ii+1| \geq |Ii|$) to the insulating film for an arbitrary time period. Then, the voltage Vi is compared with the voltage Vi+1 to find a difference between therebetween. One of the various judgment conditions is used (where Vcheck is set at an arbitrary value) and it is judged that dielectric breakdown of the insulating film has occurred if the judgment condition is satisfied by the difference between Vi and Vi+1.

3 Claims, 2 Drawing Sheets

US 6,563,334 B2

INSULATING FILM METHOD AND APPARATUS THEREFOR

BACKGROUND OF THE INVENTION

1. Field of the Invention

The present invention relates to an insulating film evaluation method of evaluating an insulating film used in a semiconductor device.

2. Description of the Related Art

With a conventional method of evaluating an insulating film used in a semiconductor device, there is obtained the amount of charge injected until dielectric breakdown of the insulating film occurs. The amount of injected charge can be obtained from the sum total of the products of (1) the values of currents flowing to the insulating film until the dielectric breakdown occurs and (2) the time periods during which the currents flow thereto. This method necessitates measuring each current flow time period until dielectric breakdown occurs. When performing this time measurement, it is important to judge whether there occurs dielectric breakdown of the insulating film.

Once dielectric breakdown of the insulating film occurs, the resistance of the insulating film is decreased, so that a voltage generated after the dielectric breakdown by the application of a current to the insulating film becomes lower than a voltage generated before the dielectric breakdown. To judge using a computer whether there occurs dielectric breakdown of the insulating film after the application of the current by utilizing this physical phenomenon, there is used a method with which a voltage $V_i$ generated in the insulating film by the application of a current $I_i$ to the insulating film is measured and it is judged that dielectric breakdown occurs if the voltage $V_i$ is lower than a reference voltage $V_a$ (having a constant value). For instance, this reference voltage $V_a$ used to make the dielectric breakdown judgment is set with reference to an initial voltage $V_0$ measured by applying an initial current $I_0$ to the insulating film for which current application is not yet performed. Alternatively, the reference voltage $V_a$ is determined according to experimental data.

In the case where the current $I_i$ applied to the insulating film is constant, the voltage $V_i$ measured after dielectric breakdown becomes lower than the voltage $V_i$ measured before the dielectric breakdown. This means that it is possible for a computer to make the dielectric breakdown judgment without any problems using the conventional judgment method if the judgment reference voltage $V_a$ is lower than the initial voltage $V_0$ and is also higher than a voltage that is estimated from a resistance resulting from dielectric breakdown. However, in the case where the current $I_i$ applied to the insulating film is not constant and is continuously or discontinuously increased during the measurement, there may be cases where the voltage $V_i$ measured after the dielectric breakdown becomes higher than the initial voltage $V_0$. Consequently, there may be cases where the judgment of dielectric breakdown cannot be properly made using the foregoing method with which it is judged that there occurs dielectric breakdown if the measured voltage $V_i$ drops below the judgment reference voltage $V_a$ ($<V_0$), that is, if a condition of "$V_a > V_i$" is satisfied.

SUMMARY OF THE INVENTION

The present invention has been made in the light of the above-mentioned problem and an object of the present invention is to provide an insulating film evaluation method with which it is properly judged whether there occurs dielectric breakdown of an insulating film even if the current $I_i$ applied to the insulating film is not constant and is continuously or discontinuously increased during measurement.

To achieve the stated object, with an insulating film evaluation method of the present invention, it is judged whether there occurs dielectric breakdown of an insulating film by comparing an absolute value $|V_i|$ of the ith measured voltage $V_i$ with an absolute value $|V_{i+1}|$ of the i+1th measured voltage $V_{i+1}$.

With this method of the present invention, it is possible to properly judge whether there occurs dielectric breakdown of an insulating film not only in the case where a current $I_i$ flowing to the insulating film is constant but also in the case where the current $I_i$ is continuously or discontinuously increased.

DETAILED DESCRIPTION OF THE PREFERRED EMBODIMENTS

The embodiments of the present invention are described in detail below with reference to the drawings.

First Embodiment

Figure 1:
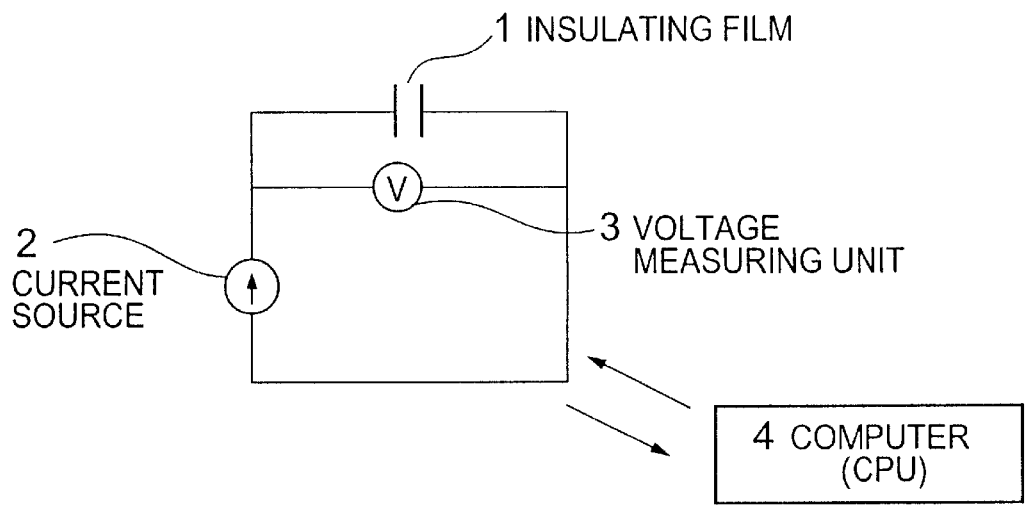
FIG. 1 illustrates a first embodiment of the present invention.

FIG. 1 illustrates a first embodiment of the present invention. In FIG. 1, there is shown a circuit having a construction where a current is applied to an insulating film 1 of a semiconductor device by a current source 2 and a voltage generated in the insulating film 1 during the application of the current is measured by a voltage measuring unit 3. Also, in the system shown in this drawing, a computer 4 instructs and performs a series of operations, such as the turning ON/OFF of the application of a current in this circuit, the control of the time period during which the current is applied, and the measurement of a voltage generated by the current application.

Second Embodiment

Figure 2:
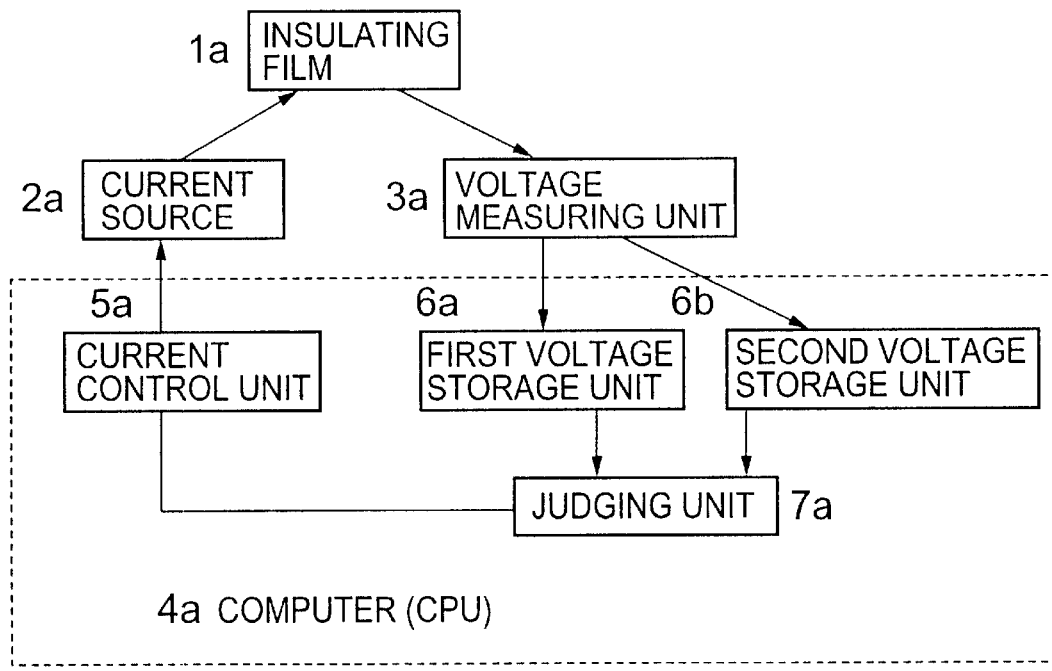
FIG. 2 illustrates a second embodiment of the present invention.

FIG. 2 illustrates a second embodiment of the present invention. In FIG. 2, there is shown a system where a current control unit 5a controls the application of a current to an insulating film 1a by a current source 2a and the interruption of the current application. When a current generated by a current source 2a is applied to the insulating film 1a, a voltage is generated in the insulating film 1a. In this system, a voltage measuring unit 3a measures the generated voltage.

The voltage measuring unit 3a measures a voltage $V_i$ ($i=1, 2, 3, \ldots$) generated by the application of a current $I_i$ ($i=1, 2, 3, \ldots$) to the insulating film 1a for an arbitrary time period under the control by the current control unit 5a, and the measurement result concerning the voltage $V_i$ ($i=1, 2, 3, \ldots$) is stored in a first voltage storage unit 6a.

Next, the voltage measuring unit 3a measures a voltage $V_{i+1}$ ($i=1, 2, 3, \ldots$) generated by the application of a current Ii+1 (i=1, 2, 3, . . . ) to the insulating film 1a for an arbitrary time period under the control by the current control unit 5a, and the measurement result concerning the voltage Vi+1 (i=1, 2, 3, . . . ) is stored in a second voltage storage unit 6b.

A judging unit 7a compares an absolute value of the voltage Vi (measurement result) stored in the first voltage storage unit 6a with an absolute value of the voltage Vi+1 (measurement result) stored in the second voltage storage unit 6b.

The judging unit 7a also judges that there occurs dielectric breakdown of the insulating film 1a if the absolute value of the voltage Vi is greater than the absolute value of the voltage Vi+1 by a predetermined positive value "Vcheck."

The judging unit 7a further judges whether the current Ii (i=1, 2, 3, . . . ) should be applied to the insulating film 1a under the control by the current control unit 5a.

It does not matter whether the current control unit 5a, the first voltage storage unit 6a, the second voltage storage unit 6b, and the judging unit 7a may be realized using each individual apparatus, or may be realized using a single apparatus or a plurality of separate apparatuses.

Also, in the case where a single apparatus is used, the current control unit 5a, the first voltage storage unit 6a, the second voltage storage unit 6b, and the judging unit 7a may be, for instance, realized using a computer (CPU) 4a.

Figure 3:
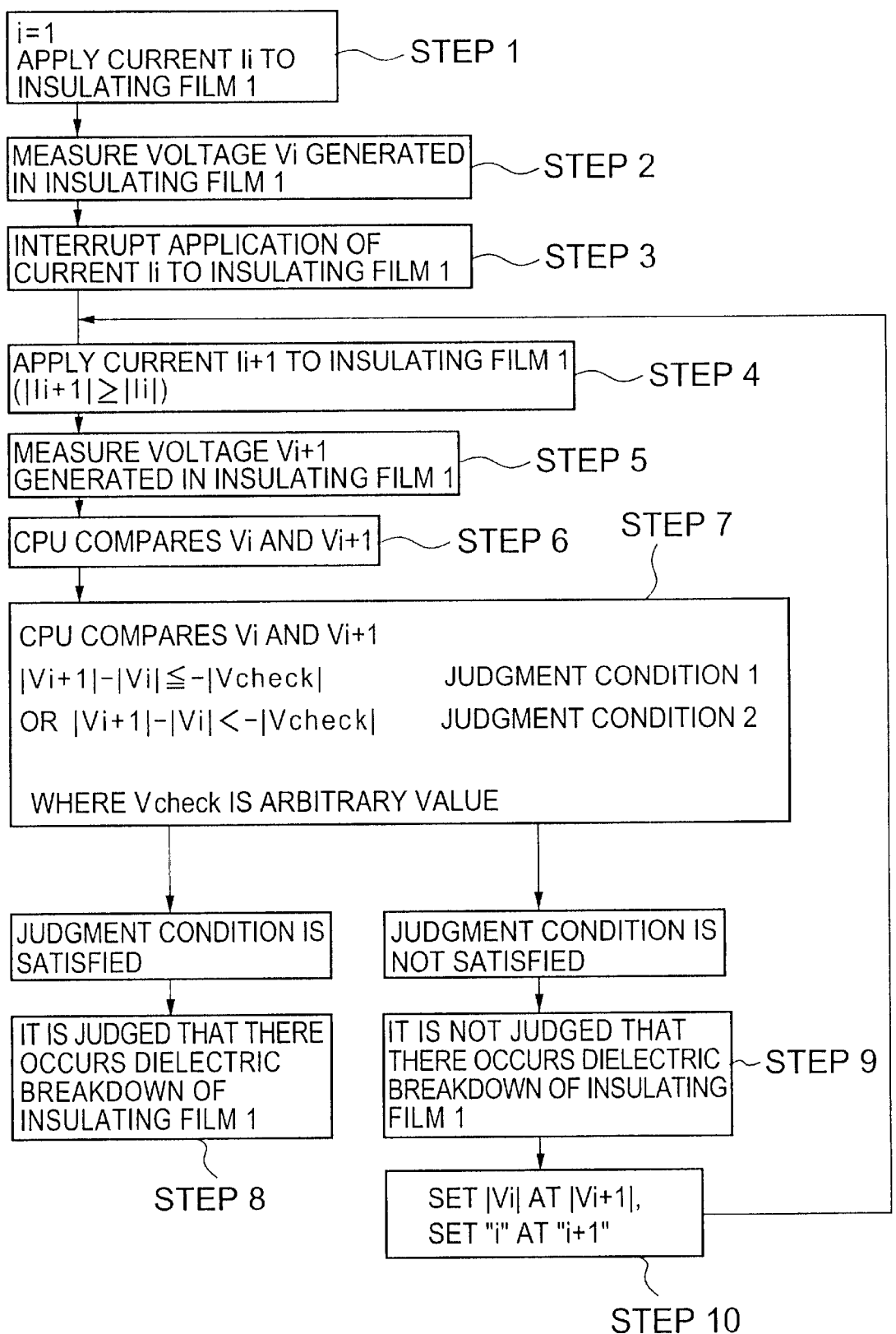
FIG. 3 shows an algorithm of the present invention according to which a judgment about the occurrence of dielectric breakdown is made.

The following description concerns an algorithm, according to which it is judged in the foregoing system whether dielectric breakdown of the insulating film 1 occurs due to the application of a current. This algorithm is explained with reference to FIG. 3.

A variable "i" is set at 1 and the current Ii is applied to the insulating film 1 for an arbitrary time period (STEP 1). Then, the voltage Vi is measured (STEP 2).

Following this, the application of the current Ii to the insulating film 1 is interrupted (STEP 3).

Next, the current Ii+1 ($|Ii+1| \geq |Ii|$) is applied to the insulating film 1 for the arbitrary time period (STEP 4), and the voltage Vi+1 is measured (STEP 5).

Following this, the application of the current Ii+1 to the insulating film 1 is interrupted (STEP 6).

Next, the absolute value of the voltage Vi is compared with the absolute value of the voltage Vi+1 to find the difference between these absolute values (STEP 7). The computer 4 controlling the system was programmed in advance to use one of the following judgment conditions (where Vcheck is set at an arbitrary value) and to judge that dielectric breakdown of the insulating film 1 occurs when the judgment condition is satisfied by the found difference.

| | |
|---|---|
| $|Vi+1|-|Vi| \leq -|Vcheck|$ | Judgement Condition 1 |
| $|Vi+1|-|Vi| < -|Vcheck|$ | Judgement Condition 2 |

If it is judged that dielectric breakdown of the insulating film 1 occurs as a result of the operation in STEP 7 (STEP 8), predetermined processing is performed and the operation is terminated.

If it is not judged that dielectric breakdown of the insulating film 1 occurs as a result of the operation in STEP 7 (STEP 9), $|V|$ is set at $|Vi+1|$ and the variable "i" is set at "i+1" (STEP 10). Then, the processing returns to STEP 4 and the current application, voltage measurement, and dielectric breakdown judgment described above are repeated until it is judged that there occurs dielectric breakdown of the insulating film 1.

In the above description, to judge whether there occurs dielectric breakdown according to the algorithm, voltages measured in sequence (for instance, the ith and i+1th measured voltages (Vi and Vi+1)) are used to judge whether there occurs dielectric breakdown. However, the present invention is not limited to the usage of voltages measured in sequence. For instance, the judgment may be made using the ith and i+2th voltages (Vi and Vi+2) or using the ith and i+3th voltages (Vi and Vi+3).

Also, in the above description, the dielectric breakdown judgment is made using absolute values of voltages (Vi, Vi+1, . . . ). However, the present invention is not limited to the usage of the absolute values of voltages. If the measured values of voltages (Vi, Vi+1, . . . ) are positive values, one of the following judgment conditions may be instead used to make the dielectric breakdown judgment.

| | |
|---|---|
| $Vi+1-Vi \leq -|Vcheck|$ | Judgement Condition 1 |
| $Vi+1-Vi < -|Vcheck|$ | Judgement Condition 2 |

Also, if the measured values of voltages (Vi, Vi+1, . . . ) are negative values, one of the following judgment conditions may be instead used to make the dielectric breakdown judgment.

| | |
|---|---|
| $-Vi+1+Vi \leq -|Vcheck|$ | Judgement Condition 1 |
| $-Vi+1+Vi < -|Vcheck|$ | Judgement Condition 2 |

Also, a fixed value may be used as the value of Vcheck applied to the dielectric breakdown judgment according to the algorithm described above. For instance, the dielectric breakdown judgment may be made by setting Vcheck at a fixed value of 10 [volt]. Further, instead of using a fixed value, the value of Vcheck used for the dielectric breakdown judgment may be changed. For instance, Vcheck may be set at 10 [volt] when V1 [volt] is compared with V2 [volt], Vcheck may be set at 10.1 [volt] when V2 [volt] is compared with V3 [volt], and Vcheck may be set at 9.9 [volt] when V3 [volt] is compared with V4 [volt]. As is apparent from this, the present invention is not limited to a case where a fixed value is used as the value of Vcheck applied to the dielectric breakdown judgment.

According to the algorithm described above, the voltage measurement is performed each time a current is applied. However, the present invention is not limited to such a case where the voltage measurement is performed each time a current is applied. For instance, the voltage measurement may be performed as follows. After the voltage Vi generated by the application of the ith current Ii is measured, the measurement of the voltage Vi+1 generated by the application of the i+1th current Ii+1 is skipped and the voltage Vi+2 generated by the application of the i+2th current Ii+2 is measured. In this case, it is judged whether there occurs dielectric breakdown using the voltages Vi and Vi+2.

Also, according to the algorithm described above, it is judged whether there occurs dielectric breakdown of the insulating film using the ith measured voltage Vi and the i+1th measured voltage Vi+1 if the ith current Ii and the i+1th current Ii+1 are in a relation of $|Ii+1| \geq |Ii|$. However, if the ith current Ii and the i+1th current Ii+1 are in a relation of $|Ii+1| < |Ii|$, the judgment cannot be made using these ith measured voltage Vi and i+1th measured voltage Vi+1. In such a case, the dielectric breakdown judgment may be made using the ith measured voltage Vi and the i+2th measured voltage Vi+2 if the ith current Ii and the i+2th current Ii+2 are in a relation of $|Ii+2| \geq |Ii|$. Also, the dielectric breakdown judgment may be made using the i+1th measured voltage Vi+1 and the i+2th measured voltage Vi+2 if the i+1th current Ii+1 and the i+2th current Ii+2 are in a relation of $|Ii+2| \geq |Ii+1|$.

As described above, with the technique of the present invention, to judge whether there occurs dielectric breakdown of an insulating film used in a semiconductor device after the application of a current to the insulating film, voltages generated before and after the application of the current to the insulating film are measured and these voltages are compared with each other to find the difference therebetween. As a result, not only in the case where the current applied to the insulating film is lower than an initial current but also in the case where the current applied to the insulating film is higher than the initial current, it is possible to properly judge whether there occurs dielectric breakdown of the insulating film.

What is claimed is:

1. An insulating film evaluation method for use in a system that controls a circuit including a current source and a voltmeter, the current source applying a current to an insulating film used in a semiconductor device, the voltmeter measuring a voltage generated when the current is applied to the insulating film, the insulating film evaluation method comprising:

a step for measuring a first voltage generated by a first current that is applied to the insulating film for an arbitrary time period;

a step for interrupting the application of the first current to the insulating film;

a step for measuring a second voltage generated by a second current that is applied to the insulating film for an arbitrary time period, an absolute value of the second current being greater than an absolute value of the first current;

a step for interrupting the application of the second current to the insulating film;

a step for comparing an absolute value of the first voltage with an absolute value of the second voltage; and a step for judging that there occurs dielectric breakdown of the insulating film if the absolute value of the first voltage is greater than the absolute value of the second voltage by an arbitrary positive value.

2. An insulating film evaluation method for use in a system that controls a circuit including a current source and a voltmeter, the current source applying a current to an insulating film used in a semiconductor device, the voltmeter measuring a voltage generated when the current is applied to the insulating film, the insulating film evaluation method comprising:

a step for measuring a first voltage generated by a first current that is applied to the insulating film for an arbitrary time period;

a step for interrupting the application of the first current to the insulating film;

a step for measuring a second voltage generated by a second current that is applied to the insulating film for an arbitrary time period, an absolute value of the second current being greater than an absolute value of the first current;

a step for interrupting the application of the second current to the insulating film;

a step for comparing an absolute value of the first voltage with an absolute value of the second voltage;

a step for judging that there occurs dielectric breakdown of the insulating film if the absolute value of the first voltage is greater than the absolute value of the second voltage by an arbitrary positive value;

a step for, if it is not judged that there occurs the dielectric breakdown of the insulating film, measuring a third voltage generated by a third current that is applied to the insulating film for an arbitrary time period, an absolute value of the third current being greater than the absolute value of the second current;

a step for interrupting the application of the third current to the insulating film;

a step for comparing the absolute value of the second voltage with an absolute value of the third voltage;

a step for judging that there occurs the dielectric breakdown of the insulating film if the absolute value of the second voltage is greater than the absolute value of the third voltage by an arbitrary positive value; and a step for, if it is not judged that there occurs the dielectric breakdown of the insulating film, repeating the application of the current, the measurement and the judgment, to judge whether there occurs the dielectric breakdown or not.

3. An insulating film evaluation apparatus comprising:

a current source;

a current control means for applying a current to an insulating film of a semiconductor device by controlling the current source;

a voltage measuring means for measuring a voltage generated when a current is applied to the insulating film;

a first storage means for storing a result of measurement of a first voltage by the voltage measuring means, the first voltage being generated by a first current applied to the insulating film for an arbitrary time period by the current control means;

a second storage means for storing a result of measurement of a second voltage by the voltage measuring means, the second voltage being generated by a second current applied to the insulating film for an arbitrary time period by the current control means, an absolute value of the second current being greater than an absolute value of the first current; and a judging means for comparing an absolute value of the measurement result stored in the first storage means with an absolute value of the measurement result stored in the second storage means, and judging that there occurs dielectric breakdown of the insulating film if the absolute value of the measurement result concerning the first voltage is greater than the absolute value of the measurement result concerning the second voltage by an arbitrary positive value.

* * * * *